(12) United States Patent
Benedict

(10) Patent No.: US 10,804,653 B2
(45) Date of Patent: Oct. 13, 2020

(54) CONDUCTIVE CONTACT FOR ELECTRICAL APPLICATIONS

(71) Applicant: HEWLETT PACKARD ENTERPRISE DEVELOPMENT LP, Houston, TX (US)

(72) Inventor: Melvin K. Benedict, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/353,015

(22) Filed: Mar. 14, 2019

(65) Prior Publication Data

US 2020/0295514 A1    Sep. 17, 2020

(51) Int. Cl.
| | |
|---|---|
| *H01R 12/72* | (2011.01) |
| *H01R 13/6587* | (2011.01) |
| *H01R 13/646* | (2011.01) |
| *H01R 13/24* | (2006.01) |
| *H05K 1/02* | (2006.01) |
| *H05K 1/14* | (2006.01) |
| *H01R 4/26* | (2006.01) |

(52) U.S. Cl.
CPC ....... *H01R 13/6587* (2013.01); *H01R 12/721* (2013.01); *H01R 13/2407* (2013.01); *H01R 13/646* (2013.01); *H05K 1/025* (2013.01); *H05K 1/144* (2013.01); *H01R 4/26* (2013.01)

(58) Field of Classification Search
CPC ................................ H01R 12/721; H01R 4/26
See application file for complete search history.

(56) References Cited

U.S. PATENT DOCUMENTS

| | | | | |
|---|---|---|---|---|
| 6,102,744 A | * | 8/2000 | Korsunsky | ........... H01R 12/721 439/637 |
| 7,210,955 B2 | * | 5/2007 | Ringler | ................ H01R 12/585 439/381 |
| 7,872,871 B2 | | 1/2011 | Hiew et al. | |
| 9,385,477 B2 | | 7/2016 | De Geest | |
| 9,801,269 B1 | | 10/2017 | Jackson et al. | |
| 1,006,925 A1 | | 9/2018 | Canning et al. | |

(Continued)

OTHER PUBLICATIONS

Ye, X. et al.; "High-Performance Inter-PCB Connectors: Analysis of EMI Characteristics"; Feb. 2002; 10 pages.

*Primary Examiner* — Tho D Ta
(74) *Attorney, Agent, or Firm* — Hewlett Packard Enterprise Patent Department

(57) ABSTRACT

Electrical contacts described herein reduce electromagnetic interference and electrical resistance for circuits that handle high-frequency electrical currents. An electrical contact described herein comprises a base portion. The length of the base portion is greater than the width of the base portion. An indentation in a first side of the base portion is opposite an indentation on a second side of the base portion. The width of the protrusion is less than the width of the base portion. The protrusion is configured to be placed against a second electrical contact to allow an electrical current to flow through the electrical contact. The position of the protrusion relative to the second electrical contact and the geometry of the protrusion can eliminate stubs that cause electromagnetic interference and increase the area of contact between the first electrical contact and the second electrical contact.

14 Claims, 8 Drawing Sheets

(56) References Cited

U.S. PATENT DOCUMENTS

| | | | |
|---|---|---|---|
| 2002/0076986 A1* | 6/2002 | Cochran | H01R 12/721 439/637 |
| 2002/0119704 A1* | 8/2002 | Ito | H01R 12/721 439/636 |
| 2005/0124223 A1* | 6/2005 | Zhang | H01R 13/245 439/637 |
| 2009/0079042 A1 | 3/2009 | Clatterbaugh et al. | |

* cited by examiner

CONDUCTIVE CONTACT FOR ELECTRICAL APPLICATIONS

BACKGROUND

Many modern electronic devices, such as desktop computers, laptop computers, and servers include printed circuit board (PCBs). Within a single device, two circuit boards can be electrically coupled together via a board-to-board connector (e.g., a card edge connector). Other components, such as cables, can also be electrically coupled to circuit boards via other types of connectors. Connectors that electrically couple two components together typically include at least one electrical contact through which an electrical current can flow between the two coupled components. Electrical currents generate electromagnetic patterns (e.g., magnetic fields). The composition of the electromagnetic patterns generated by a particular electrical current depends on the properties of that current (e.g., frequency and amplitude for alternating currents) and on the physical structure and chemical composition of the components through which the electrical current flows (e.g., the structure of wires, contacts, resistors, capacitors, etc.).

BRIEF DESCRIPTION OF THE DRAWINGS

Various features and advantages will become apparent from the following description, given by way of example only, which is made with reference to the accompanying drawings, of which.

DETAILED DESCRIPTION

As data transfer rates between interconnected components increase with new generations of computing devices (e.g., servers), several challenges arise with respect to the connectors that electrically couple components of those computing devices together. For example, when increased data transfer rates are achieved by increasing the frequencies of electrical currents that flow between components, electromagnetic interference (EMI) produced by those connectors also tends to increase. Specifically, connectors can be a major cause of radiated emissions from computing systems that have data transfer rates of over 2 gigabits per second between connected components. Devices that produce EMI exceeding certain thresholds specified by law are prohibited in a number of countries (e.g., the United States). Hence, connectors that produce excessive interference at high frequencies may hamper efforts to ensure compliance with applicable laws when data transfer rates are increased.

The structure of the electrical contacts within a connector can strongly influence the EMI the connector generates when an electrical current flows through the connector. Furthermore, the structure of the electrical contacts also influences properties such as electrical resistance. Electrical resistance, in turn, influences other properties of interest, such as voltage and current carrying capacity. For example, if resistance increases, the current carrying capacity will decrease. Also, the higher the electrical resistance of a component is, the more energy is lost through that component in the form of heat. The heat generated by components with high resistance can present a challenge for the thermal components that are designed to cool computing systems. As the resistance increases the voltage drop across the contact to compensate for the loss the voltage has to be increased.

Electrical contacts, connectors, and circuit boards described herein address the challenges discussed above. Specifically, the present disclosure provides several different structures for electrical contacts that reduce EMI and electrical resistance relative to existing electrical contacts. In an example described herein, an electrical contact comprises a protrusion that is strategically formed and positioned on the contact. The geometry and the position of the protrusion help the contact achieve reduced EMI, reduced electrical resistance, and other advantages over existing electrical contacts.

Figure 1A:
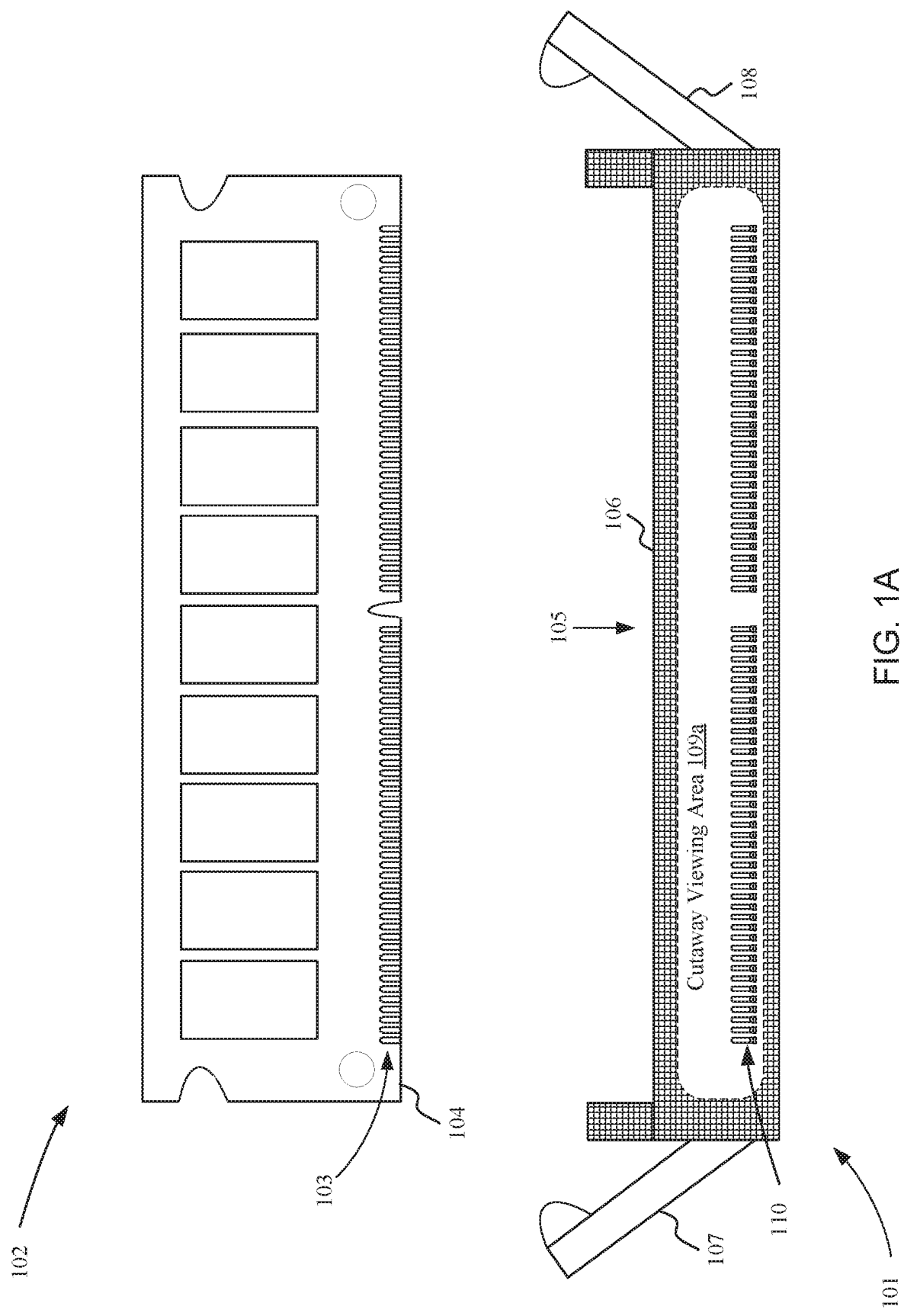
FIG. 1A illustrates an example connector and an example circuit board that are separated from each other.
Figure 1B:
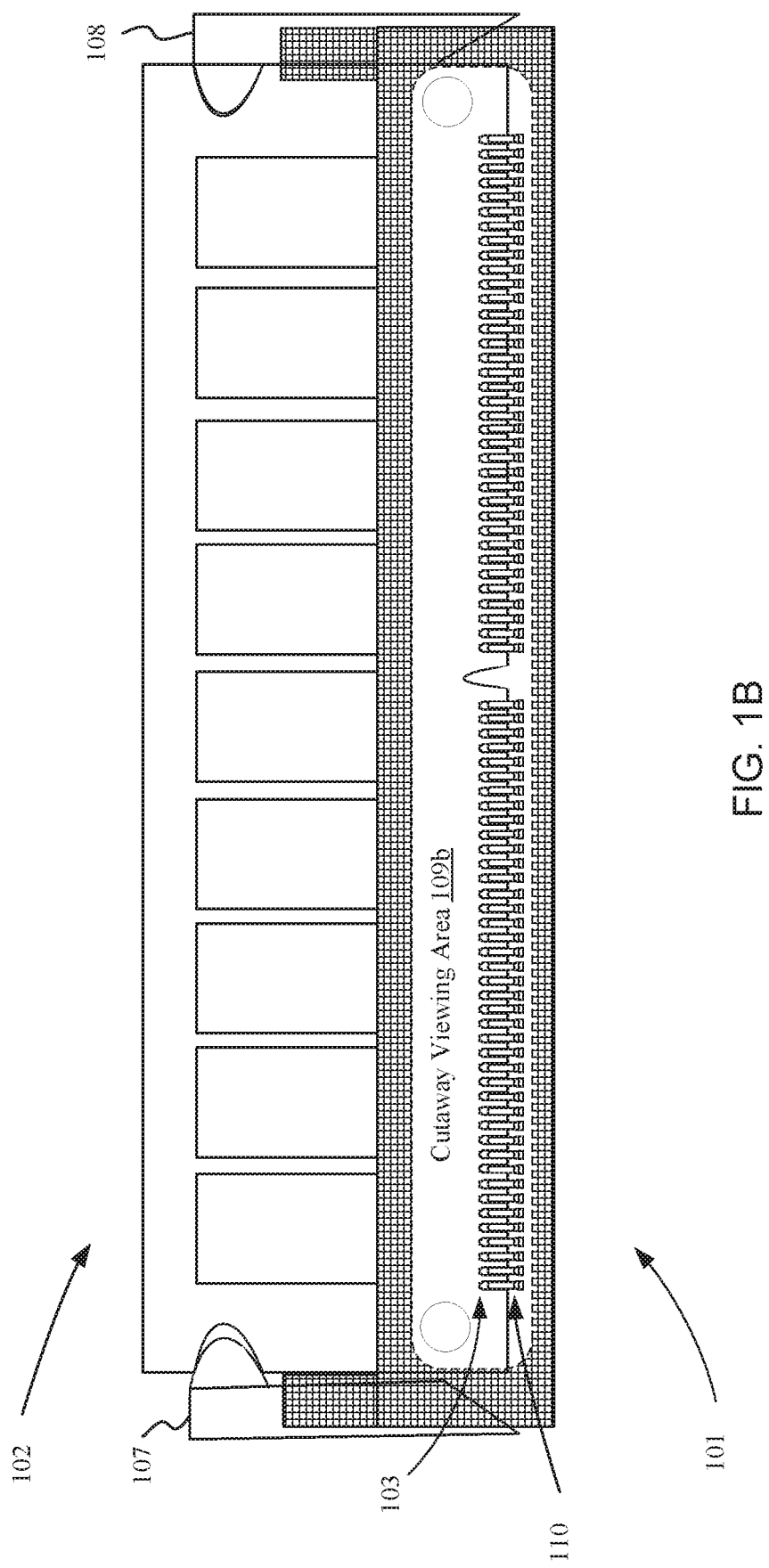
FIG. 1B shows the example circuit board seated within the example connector.

FIGS. 1A and 1B show one example of a connector 101 (e.g., a board-to-board connector) and a circuit board 102 (e.g., a dual in-line memory module (DIMM)) configured to be inserted therein. Specifically, FIG. 1A illustrates the circuit board 102 and the connector 101 separately. FIG. 1B shows the circuit board 102 seated within the connector 101.

With respect to FIG. 1A, a row 103 of electrical contacts (e.g., pins or fingers) is positioned along an edge 104 of the circuit board 102 that is configured to be inserted into a socket 105 through an opening on the side 106 of the connector 101 that is proximal to the edge of the circuit board 102 on which the row 104 of electrical contacts is positioned. Latch 107 and latch 108 are shown in open positions such that the circuit board 102 can readily be inserted into the socket 105 of the connector 101 via the opening in the side 106.

As shown in the cutaway viewing area 109a, there is also a row 110 of electrical contacts positioned within the interior of the socket 105. The electrical contacts of row 110 are configured to deform resiliently when the edge 104 of the circuit board 102 is inserted into a fully seated position within the socket 105 via the opening in the side 106 such that resilient forces of the electrical contacts of row 110 press the electrical contacts of row 110 against corresponding electrical contacts of row 103.

FIG. 1B shows the circuit board 102 seated within the connector 101. As shown in the cutaway viewing area 109b, each electrical contact of row 110 aligns with, and presses against (e.g., via a resilient force), a corresponding electrical contact of row 103. Also, in FIG. 1B, latch 107 and latch 108 are in closed positions to ensure that the circuit board 102 is held in a fully seated position within the socket.

While FIGS. 1A and 1B show one example of a circuit board and a connector to provide illustrative context for further examples discussed herein, persons of skill in the art will understand that other types of connectors and components other than circuit boards may be used without departing from the spirit and scope of this disclosure.

Figure 2A:
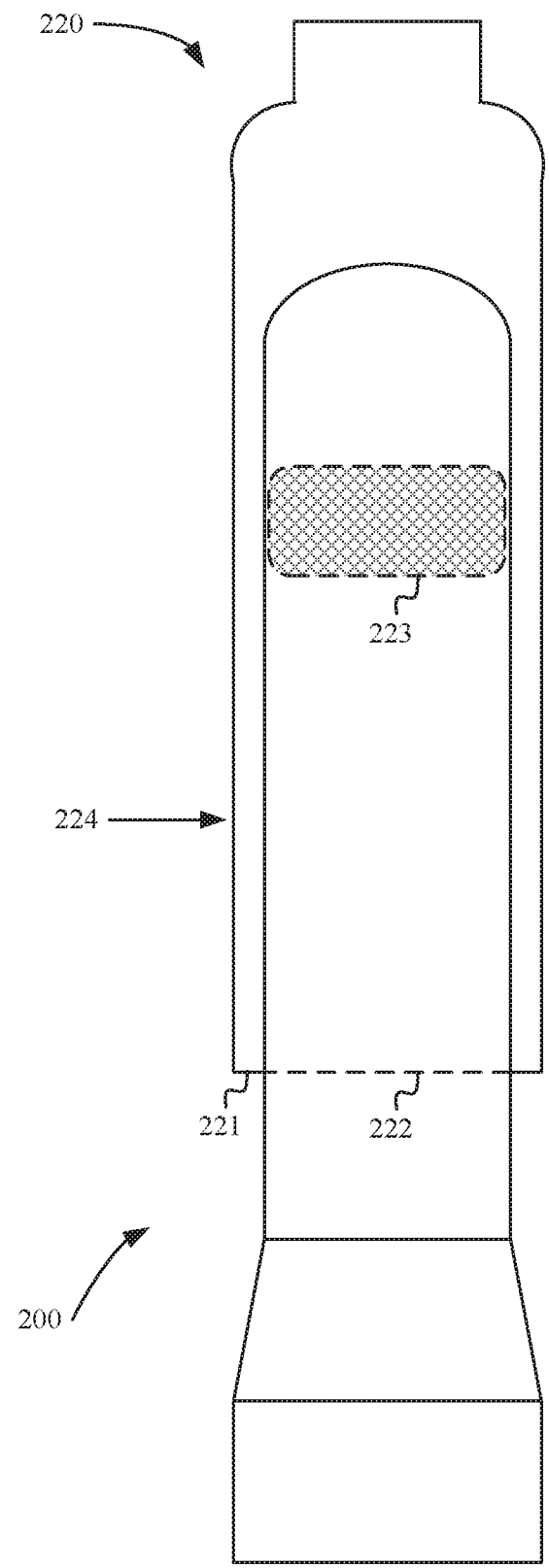
FIG. 2A illustrates a view of a first electrical contact pressed against a second electrical contact.
Figure 2B:
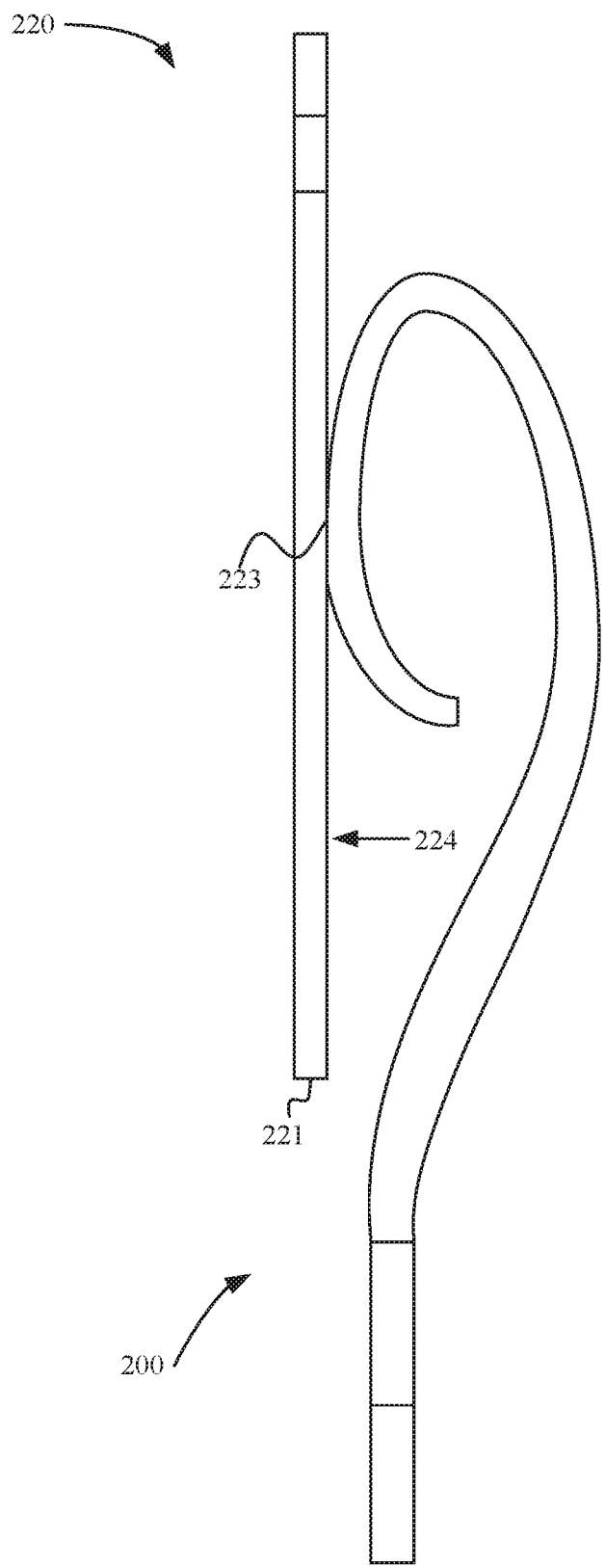
FIG. 2B illustrates a profile view of the content shown in FIG. 2A.

FIG. 2A illustrates a first view (e.g., a top view) of a first electrical contact 200 pressed against a second electrical contact 220 (e.g., as one of the electrical contacts in row 110 is pressed against a corresponding electrical contact in row 103 in FIG. 1B). FIG. 2B illustrates a second view of the electrical contact 200 pressed against the electrical contact 220 that results from rotating the content of FIG. 2A counterclockwise by ninety degrees about the Y-axis of a Cartesian coordinate system.

In FIG. 2A, the electrical contact 200 is pressed against a flat surface of the electrical contact 220 by a resilient force of the electrical contact 200. The electrical contact 200 is formed in a curled geometry, as shown in FIG. 2B, so that the resilient force results when a component on which the electrical contact 220 is disposed is fully seated within a connector in which the electrical contact 200 is mounted.

For clarity in illustration, the component and the connector are not shown. However, in one example, the component may be a circuit board such as a dual in-line memory module (DIMM), a non-volatile memory express (NVMe) solid-state drive (SSD), a graphics card, or some other type of circuit board configured to be inserted into the connector. In other examples, the component may be a cable (e.g., an Ethernet cable or a universal serial bus (USB) cable), or some other type of component configured to have an electrical current passed through itself.

The dashed line 222 represents the portion of the terminal edge 221 of the second electrical contact 220 that is positioned behind the electrical contact 200 relative to the viewing angle shown in FIG. 2A. The selection 223 represents an area of contact over which the electrical contact 100 and the electrical contact 220 actually touch each other. The selection 223 is outlined using a dashed line in FIG. 2A to signify that the contact area is on the side of the electrical contact 200 that is facing the electrical contact 220.

The position and geometry of the contact area represented by selection 223 can be problematic for transferring high frequency electrical currents between the electrical contact 200 and the electrical contact 220. For example, a stub 224 of the electrical contact 220 extends past the contact area to the terminal edge 221. The stub 224 can cause a discontinuity in electrical impedance and signal reflections when electrical currents flow between the electrical contact 200 and the electrical contact 220. Such signal reflections increase as the frequency of the electrical current increases. Furthermore, the contact area is small relative to the surface area on the side of the connector 200 that faces the connector 220. This relatively small ratio of the contact area to the surface area on the side of the connector 200 that faces the connector 220 results in an amount of electrical resistance that is unnecessarily high when electrical currents flow through between the electrical contact 200 and the electrical contact 220. The small contact area can act as a bottleneck that hampers an electrical current. Due to the small contact area and the connector tolerances the point of electrical contact will vary slightly with repeated insertions. This can cause intermittent issues due to actual contact position and the resulting change in high frequency characteristics of the connection.

Figure 3A:
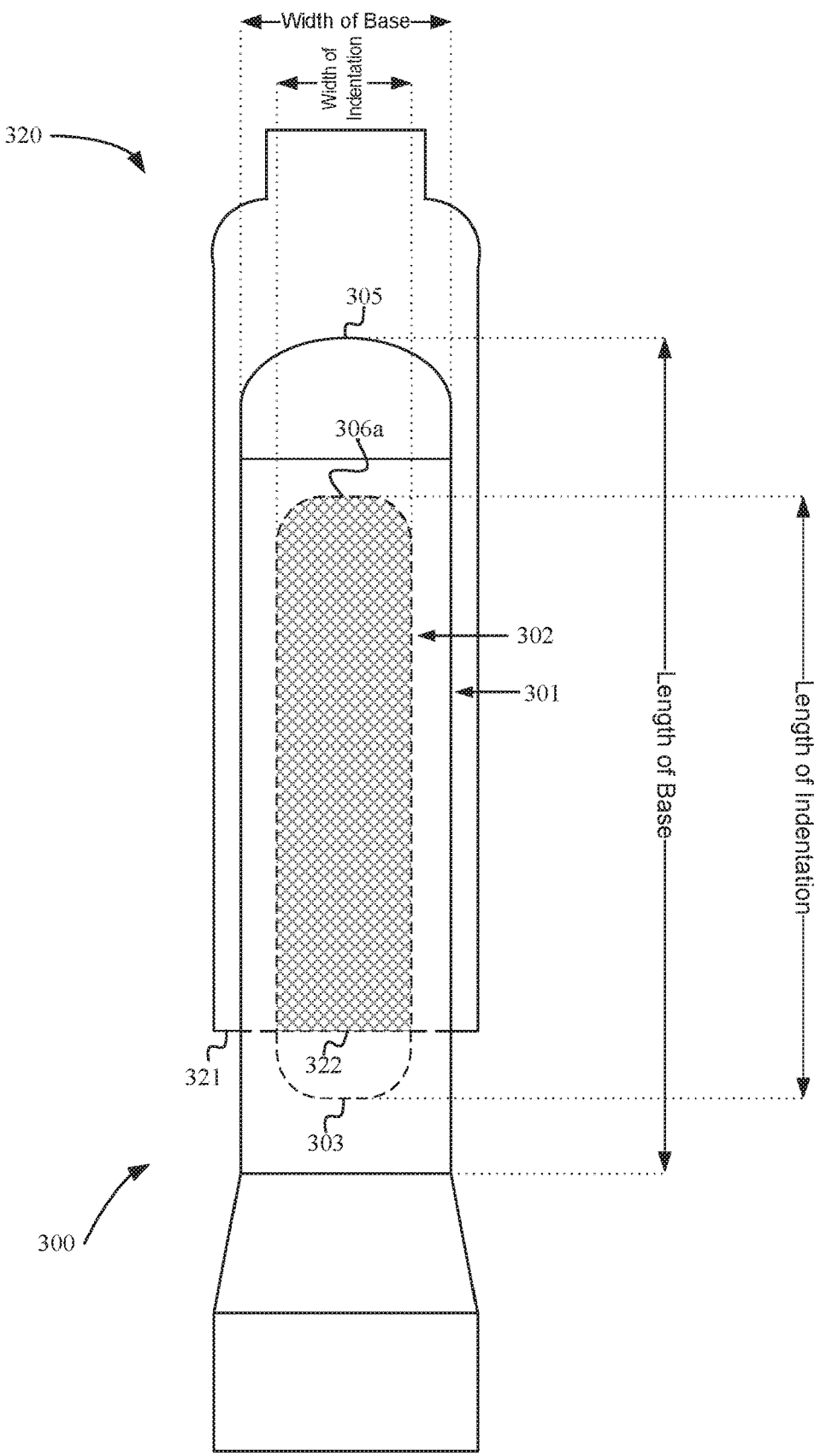
FIG. 3A illustrates a view of a first example electrical contact that reduces resistance and impedance pressed against a second electrical contact.
Figure 3B:
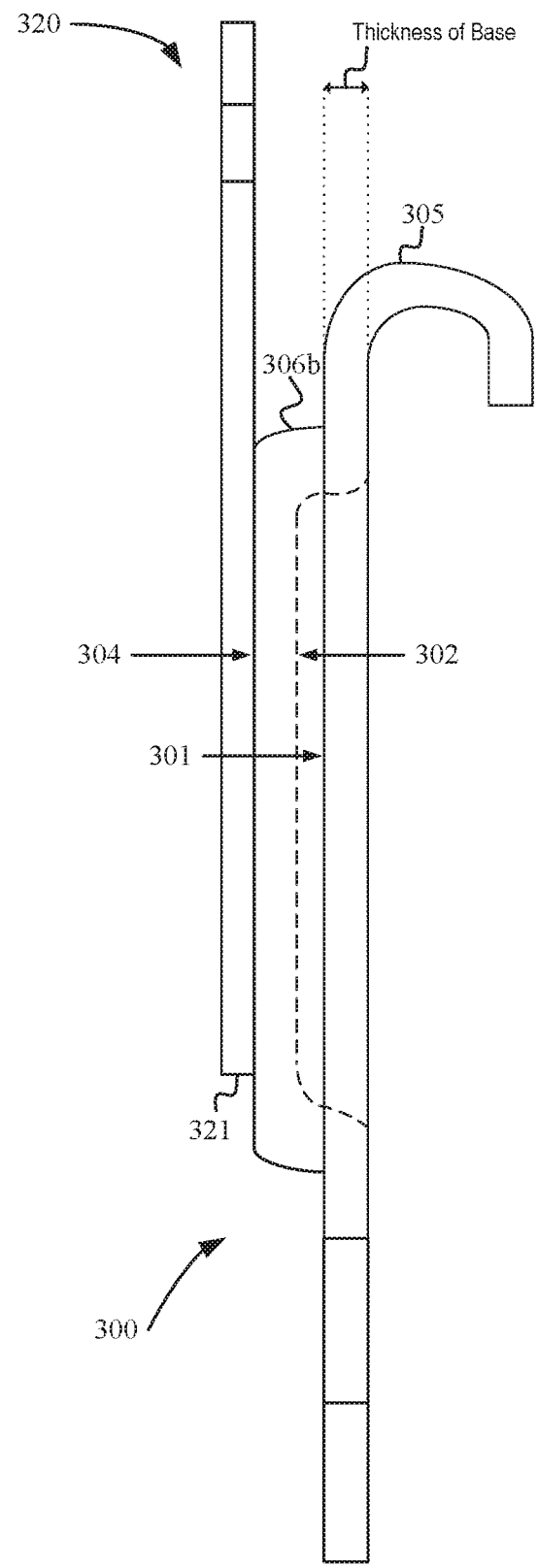
FIG. 3B illustrates a profile view of the content shown in FIG. 3A.

FIGS. 3A and 3B show an example of an electrical contact that reduces electrical resistance and reduces signal reflections for high frequency electrical currents. Specifically, FIG. 3A illustrates a first view (e.g., a top view) of a first electrical contact 300 pressed against a second electrical contact 320 (e.g., as one of the electrical contacts in row 110 is pressed against a corresponding electrical contact in row 103 in FIG. 1B). FIG. 3B illustrates a second view of the electrical contact 300 pressed against the electrical contact 320 that results from rotating the content of FIG. 3A counterclockwise by ninety degrees about the Y-axis of a Cartesian coordinate system.

In FIG. 3A, the electrical contact 300 is pressed against a flat surface of the second electrical contact 320 by a resilient force of the electrical contact 300. The electrical contact 300 includes a base portion 301 and an indentation 302. As shown in FIG. 3B, the indentation 302 results in a protrusion 304 on the side of the electrical contact 300 that faces the electrical contact 320. The geometry of the electrical contact 300 and the resilience of the conductive material that makes up the electrical contact 300 may cause the resilient force that presses the electrical contact 300 against the electrical contact 320 when a component on which the electrical contact 320 is disposed is fully seated within a connector in which the electrical contact 300 is mounted. As shown, the indentation 302 and the protrusion 304 may be centered relative to the width direction of the base portion 301. Some examples of conductive materials that the electrical contact 300 may comprise one or more metals such as gold, copper, platinum, silver, aluminum, and iron. Also, steel or other alloys that can serve as conductors may include metals such as chromium and mercury.

Again, for clarity in illustration, the component and the connector are not shown. However, in one example, the component may be a circuit board such as a DIMM, a NVMe SSD, a graphics card, or some other type of circuit board configured to be inserted into the connector. In other examples, the component may be a cable (e.g., an Ethernet cable or a USB cable) or some other type of component configured to have an electrical current passed through itself.

The dashed line 322 represents the portion of the terminal edge 321 of the second electrical contact 320 that is positioned behind the electrical contact 300 relative to the viewing angle shown in FIG. 3A. The shaded portion enclosed by the perimeter of the indentation 302 represents the contact area over which the electrical contact 300 and the electrical contact 320 actually touch each other.

As shown FIG. 3B, the edge 303 of the protrusion 304 extends past the terminal edge 321 of the electrical contact 320. The edge 303 is distal relative to an opening through which the component on which the connector 320 is mounted can be inserted into the connector in which the contact 300 is mounted. The terminal edge 321 of the electrical contact 320 is proximal to an edge of the component on which the electrical contact 320 is mounted that is inserted through the opening.

Since the edge 303 of the protrusion 304 extends past the terminal edge 321 of the electrical contact 320, there is no stub leading up to the terminal edge 321 of the electrical contact 320. The lack of such a stub allows high frequency electrical currents to be transferred between the electrical contact 300 and the electrical contact 320 without producing the signal reflections and other electromagnetic interference that a stub would produce. Furthermore, the contact area (i.e., the shaded portion of the indentation 302) is also larger than the contact area that is produced by the geometries of existing electrical contacts. The increased contact area results in lower electrical resistance.

As shown in FIG. 3A, the length of the base portion 301 of the electrical contact 300 may be greater than the width of the base portion 301. The width of the protrusion 304 or the indentation 302, in turn, may be less than the width of the base portion 301. In one example, the ratio of the width of the protrusion 304 or the indentation 302 to the width of the base portion 301 ranges between one tenth and four fifths, inclusive. In general, the width of the protrusion 304 and the width of the indentation 302 are closely related because the protrusion 304 and the indentation 302 generally refer to opposite sides of the same geometric form feature within the electrical contact 300. The width of the indentation 302 may be a lower bound for the width of the protrusion 304, while the sum of the width of the indentation 302 and twice the thickness of the base portion 301 may be an upper bound for the width of the protrusion 304.

In addition, the length of the protrusion 304 or the indentation 302 may be less than the length of the base portion 301. In one example, the ratio of the length of the protrusion 304 or the indentation 302 to the length of the base portion 301 may range between one tenth and two fifths, inclusive. Also, in some examples, the length of the protrusion may range between 60 mils and 80 mils, inclusive (where a "mil" is equal to one thousandth of one inch or approximately 0.0254 millimeters).

As explained above with regard to the width of the protrusion and the width of the indentation, the length of the protrusion 304 and the length of the indentation 302 are closely related because the protrusion 304 and the indentation 302 generally refer to opposite sides of the same geometric form feature within the electrical contact 300. The length of the indentation 302 may be a lower bound for the length of the protrusion 304, while the sum of the length of the indentation 302 and twice the thickness of the base portion 301 may be an upper bound for the length of the protrusion 304.

In some examples, the terminal edge 305 of the base portion may extend past the terminal edge 306b of the protrusion 304 (or the terminal edge 306a of the indentation) by a distance that may range from one sixteenth to one sixth of the length of the protrusion 304 (or the length of the indentation 302). Also, in some examples, the distance by which the terminal edge 305 of the base portion extends past the terminal edge 306b of the protrusion may range between 5 mils and 8 mils, inclusive.

The resilient force that presses the electrical contact 300 against the electrical contact 320 may result from resilient deformation of the protrusion 304, the curled geometry along the terminal edge 305, or some other portion of the electrical contact 300.

Figure 4A:
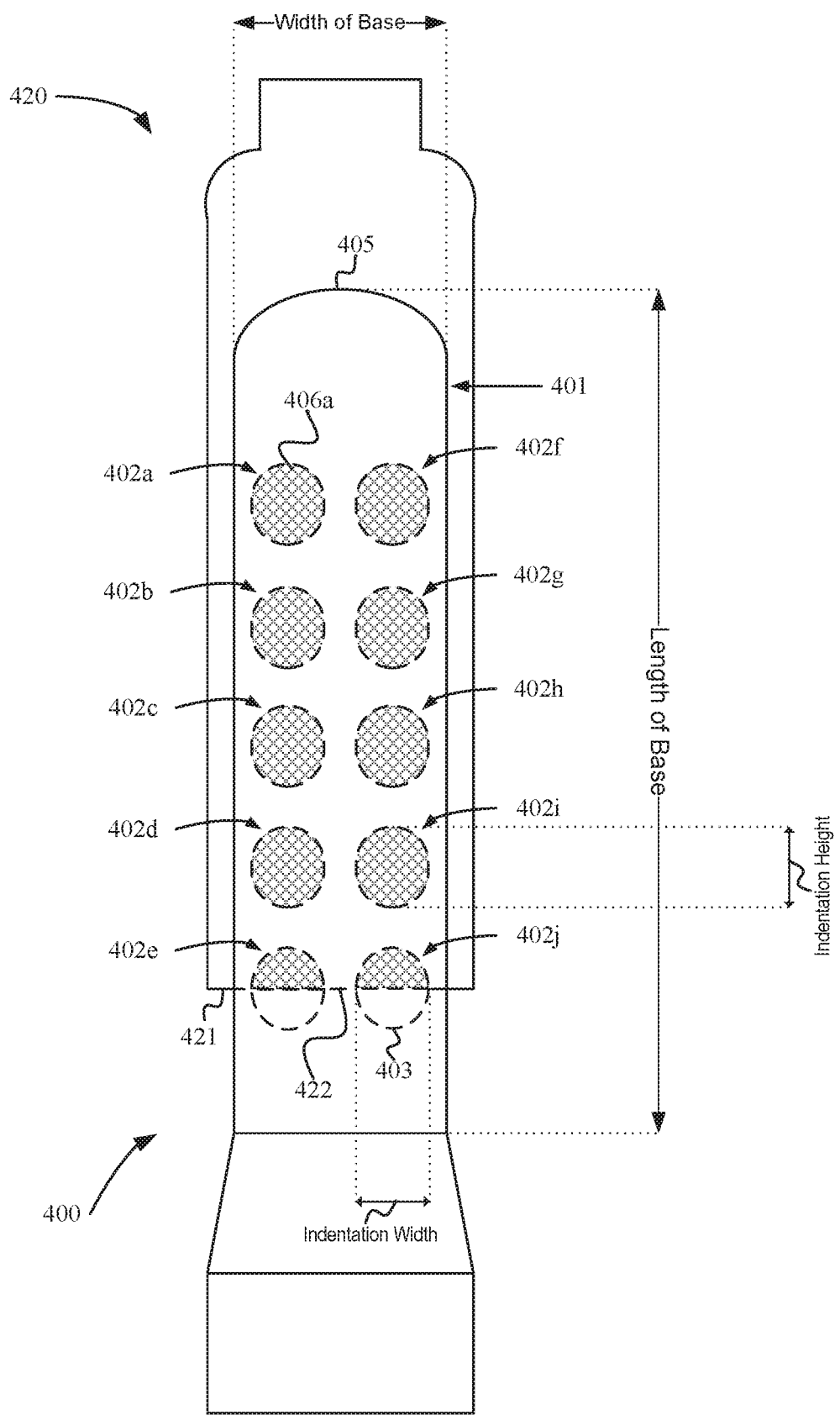
FIG. 4A illustrates a view of a second example electrical contact that reduces resistance and impedance pressed against a second electrical contact.
Figure 4B:
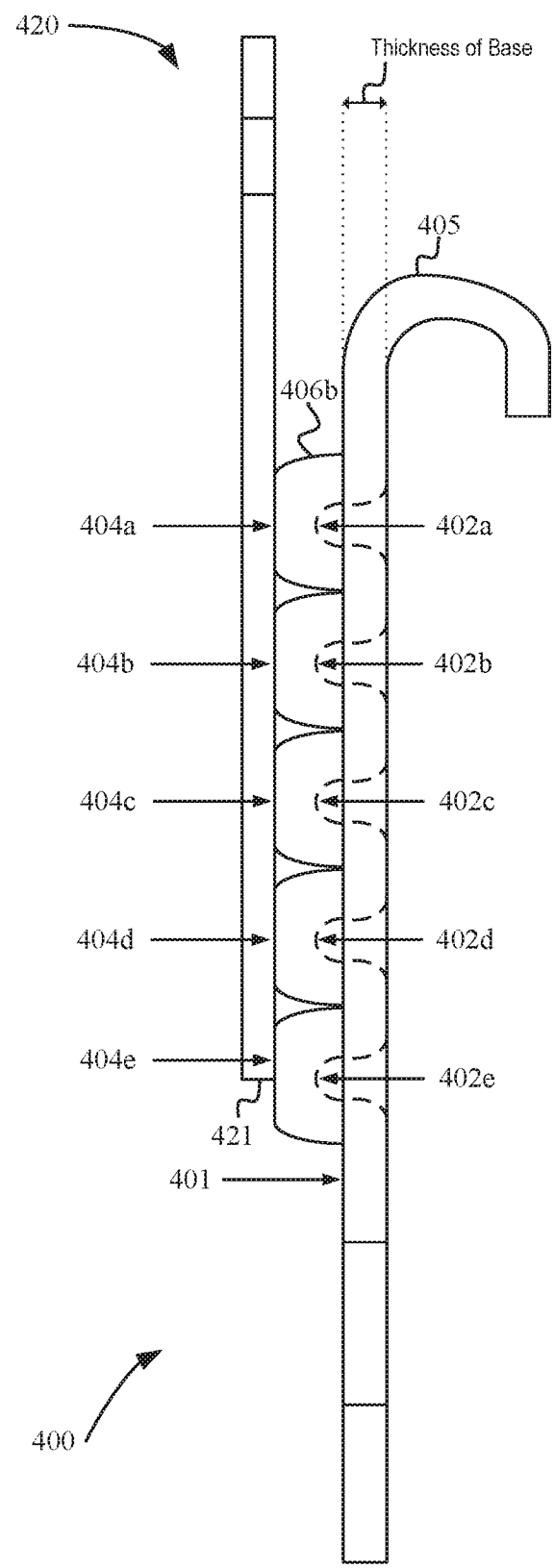
FIG. 4B illustrates a profile view of the content shown in FIG. 4A.

FIGS. 4A and 4B show another example of an electrical contact that reduces electrical resistance and reduces signal reflections for high frequency electrical currents. Specifically, FIG. 4A illustrates a first view (e.g., a top view) of a first electrical contact 400 pressed against a second electrical contact 420 (e.g., as one of the electrical contacts in row 110 is pressed against a corresponding electrical contact in row 103 in FIG. 1B). FIG. 4B illustrates a second view of the electrical contact 400 pressed against the electrical contact 420 that results from rotating the content of FIG. 4A counterclockwise by ninety degrees about the Y-axis of a Cartesian coordinate system.

In FIG. 4A, the electrical contact 400 is pressed against a flat surface of the electrical contact 420 by a resilient force of the electrical contact 400. The electrical contact 400 includes a base portion 401 and a plurality of indentations 402a-j. The indentations 402a-j result in a plurality of corresponding protrusions on the side of the electrical contact 400 that faces the electrical contact 420. Specifically, the protrusions 404a-404e shown in FIG. 4B correspond to the 402a-e; the protrusions corresponding to the indentations 402f-j are behind the protrusions 404a-e relative to the viewing angle of FIG. 4B and are therefore not visible in FIG. 4B.

The geometry of the electrical contact 400 and the resilience of the conductive material that makes up the electrical contact 400 (e.g., a pure metal or an alloy) may cause the resilient force that presses the electrical contact 400 against the electrical contact 420 when a component on which the electrical contact 420 is disposed is fully seated within a connector in which the electrical contact 400 is mounted.

Again, for clarity in illustration, the component and the connector are not shown. However, as explained in examples described above, the component may be a circuit board such as a DIMM, a NVMe SSD, a graphics card, or some other type of circuit board configured to be inserted into the connector. In other examples, the component may be a cable (e.g., an Ethernet cable or a USB cable) or some other type of component configured to have an electrical current passed through itself.

The dashed line 422 represents the portion of the terminal edge 421 of the second electrical contact 420 that is positioned behind the electrical contact 400 relative to the viewing angle shown in FIG. 4A. The shaded portions of the indentations 402a-j represent the collective contact area over which the electrical contact 400 and the electrical contact 420 actually touch each other.

As shown FIG. 4B, the edge 403 of indentation 402e extends past the terminal edge 421 of the electrical contact 420. As a result, there is no stub on the terminal edge of the electrical contact 420. As explained above with respect to previous examples, the lack of such a stub allows high frequency electrical currents to be transferred between the electrical contact 400 and the electrical contact 420 without producing the signal reflections and other electromagnetic interference that a stub would produce. Furthermore, the cumulative contact area (i.e., the shaded portions enclosed by the perimeters of indentations 402a-j) is also larger than the contact area that is produced by the geometries of existing electrical contacts. As explained above with respect to previous examples, the increased contact area results in lower electrical resistance.

As shown in FIG. 4A, the length of the base portion of the electrical contact 400 may be greater than the width of the base portion. The width of each of the protrusions 404a-e (or of the indentations 402a-j), in turn, may be less than the width of the base portion. In one example, the ratio of the width of at least one of the protrusions 404a-e (or at least one of the indentations 402a-j) to the width of the base portion ranges between one twentieth and two fifths, inclusive.

In general, the width of protrusion 404a and the width of the corresponding indentation 402a are closely related because the protrusion 404a and the indentation 402a generally refer to opposite sides of the same geometric form feature within the electrical contact 400. The width of the indentation 402a may be a lower bound for the width of the protrusion 404a, while the sum of the thickness of the base portion 401 and the width of the indentation 402a may be an upper bound for the width of the protrusion 404a. This same relationship may apply to any of the protrusions 404a-e and their corresponding indentations 402a-e, respectively.

In addition, the length of the protrusion 404a may be less than the length of the base portion 401. In one example, the ratio of the length of the protrusion 404a (or the corresponding indentation 402a) to the length of the base portion 401 may range between one tenth and two fifths, inclusive. Again, this same relationship may apply to any of the protrusions 404a-e and their corresponding indentations 402a-e, respectively. Also, in some examples, the length of the protrusion 404a (or the corresponding indentation 402a) may range between 60 mils and 80 mils, inclusive.

Although the indentations 402*a-j* are shown as circular in FIG. 4A, the 402*a-j* (and the cross-sectional geometries of the corresponding protrusions 404*a-j*) may have different shapes in other examples.

In some examples, the terminal edge 405 of the base portion 401 may extend past the terminal edge 406*b* of the protrusion 402*a* (or the terminal edge 406*a* of the indentation 402*a*) by a distance that may range from one sixteenth to one sixth of the length of the protrusion. Also, in some examples, the distance by which the terminal edge 405 of the base portion 401 extends past the terminal edge 406*b* of the protrusion 402*a* (or the terminal edge 406*a* of the indentation 402*a*) may range between 5 mils and 8 mils, inclusive.

While the present techniques may be susceptible to various modifications and alternative forms, the embodiments discussed above have been provided only as examples. It is to be understood that the techniques are not intended to be limited to the particular examples disclosed herein. Indeed, the present techniques include all alternatives, modifications, and equivalents falling within the true spirit and scope of the appended claims.

EXAMPLES

The following additional examples are included below to highlight several aspects of the apparatuses described herein. However, the scope of the disclosure is not limited to these additional examples or the other examples described herein.

Example 1 includes an electrical contact comprising: a base portion, wherein a length of the base portion is greater than a width of the base portion; an indentation in a first side of the base portion; and a protrusion on a second side of the base portion, wherein: the second side of the base portion is opposite the first side and the protrusion is opposite the indentation, and a width of the protrusion is less than the width of the base portion.

Example 2 includes the electrical contact of claim 1, wherein a length of the protrusion is less than the length of the base portion.

Example 3 includes the electrical contact of claim 1 or 2, further comprising: one or more additional indentations on the first side of the base portion; and one or more additional protrusions on the second side of the base portion, wherein the one or more additional protrusions are opposite the one or more additional indentations.

Example 4 includes the electrical contact of claim 1, 2, or 3, wherein a ratio of a length of the protrusion to the length of the base portion is inclusively between one tenth and two fifths.

Example 5 includes the electrical contact of claim 1, 2, 3, or 4, wherein a terminal edge of the base portion extends past a terminal edge of the protrusion by a distance that is inclusively between 5 mils and 8 mils.

Example 6 includes the electrical contact of claim 1, 2, 3, 4, or 5, wherein a ratio of the width of the protrusion to the width of the base portion is inclusively between one tenth and four fifths.

Example 7 includes the electrical contact of claim 1, 2, 3, 4, 5, or 6, wherein the protrusion and the indentation are centered relative to a direction of the width of the base portion.

Example 8 includes an electrical connector comprising: a socket with an opening; an electrical contact positioned within an interior region of the socket, the electrical contact comprising: a base portion, wherein a length of the base portion is greater than a width of the base portion; an indentation in a first side of the base portion; and a protrusion on a second side of the base portion, wherein: the second side of the base portion is opposite the first side and the protrusion is opposite the indentation, and a width of the protrusion is less than the width of the base portion.

Example 9 includes the electrical connector of claim 8, wherein: the socket is configured to have an edge of a printed circuit board (PCB) inserted therein via the opening; and the electrical contact is configured to resiliently deform when the edge of the PCB is fully seated in the socket such that a resilient force of the electrical contact presses the protrusion against a second electrical contact that is positioned along the edge of the PCB.

Specifically, with regard to the configuration, the width and thickness of the opening and the interior of the socket may match the width and thickness of the PCB. Also, the positioning of the electrical contact within the socket may be such that the resilient force holding the electrical contact against the second contact, when multiplied by a coefficient of friction between the electrical contact and the second electrical contact, quantifies a frictional force that resists removal of the PCB from the socket.

Example 10 includes the electrical connector of claim 9, wherein an edge of the protrusion that is distal relative to the opening is configured to extend past an edge of the second electrical contact that is proximal to the edge of the PCB by a distance ranging from 5 mils to 8 mils when the edge of the PCB is fully seated in the socket.

Example 11 includes the electrical connector of claim 8, 9, or 10, wherein a terminal edge of the base portion extends past a terminal edge of the protrusion by a distance ranging from 5 mils to 8 mils.

Example 12 includes the electrical connector of claim 8, 9, 10, or 11, wherein a ratio of a length of the protrusion to the length of the base portion is inclusively between one tenth and two fifths.

Example 13 includes the electrical connector of claim 8, 9, 10, 11, or 12, wherein the electrical contact further comprises: one or more additional indentations on the first side of the base portion; and one or more additional protrusions on the second side of the base portion, wherein the one or more additional protrusions are positioned opposite the one or more additional indentations.

Example 14 includes the electrical connector of claim 8, 9, 10, 11, 12, or 13, wherein a ratio of the width of the protrusion to the width of the base portion is inclusively between one tenth and four fifths.

Example 15 includes the electrical connector of claim 8, 9, 10, 11, 12, 13, or 14, wherein the protrusion and the indentation are centered relative to a direction of the width of the base portion.

Example 16 includes an apparatus comprising: a socket with an opening; a first electrical contact positioned within an interior region of the socket, the first electrical contact comprising: a base portion, wherein a length of the base portion is greater than a width of the base portion; an indentation in a first side of the base portion; and a protrusion on a second side of the base portion, wherein: the second side of the base portion is opposite the first side and the protrusion is opposite the indentation, and a width of the protrusion is less than the width of the base portion; a printed circuit board (PCB) comprising: an edge of the PCB that is seated in the socket via the opening; a second electrical contact that is positioned along the edge of the PCB and is pressed against the protrusion via a resilient force of the first electrical contact.

Example 17 includes the apparatus of claim 16, wherein an edge of the protrusion that is distal relative to the opening is configured to extend past an edge of the second electrical contact that is proximal to the edge of the PCB by a distance ranging from 5 mils to 8 mils.

Example 18 includes the apparatus of claim 16 or 17, wherein a terminal edge of the base portion extends past a terminal edge of the protrusion by a distance ranging from 5 mils to 8 mils.

Example 19 includes the apparatus of claim 16, 17, or 18, wherein a ratio of a length of the protrusion to the length of the base portion is inclusively between one tenth and two fifths.

Example 20 includes the apparatus of claim 16, 17, 18, or 19, wherein the first electrical contact further comprises: one or more additional indentations on the first side of the base portion; and one or more additional protrusions on the second side of the base portion, wherein the one or more additional protrusions are positioned opposite the one or more additional indentations.

Example 21 includes the apparatus of claim 16, 17, 18, 19, or 20, wherein a ratio of the width of the protrusion to the width of the base portion is inclusively between one tenth and four fifths.

Example 22 includes the apparatus of claim 16, 17, 18, 19, 20, or 21, wherein the protrusion and the indentation are centered relative to a direction of the width of the base portion.

What is claimed is:

1. An electrical connector comprising:
    a socket with an opening, wherein a width of the opening and a thickness of the opening match a width of an edge of a printed circuit board (PCB) and a thickness of the edge of the PCB, respectively;
    an electrical contact positioned within an interior region of the socket, the electrical contact comprising:
        a base portion, wherein a length of the base portion is greater than a width of the base portion;
        an indentation in a first side of the base portion; and
        a protrusion on a second side of the base portion, wherein:
            the second side of the base portion is opposite the first side and the protrusion is opposite the indentation,
            a width of the protrusion is less than the width of the base portion, and
            the electrical contact is configured to resiliently deform when the edge of the PCB is fully seated in the socket such that:
                a resilient force of the electrical contact presses the protrusion against a second electrical contact that is positioned along the edge of the PCB; and
                a contact area over which the electrical contact and the second electrical contact touch each other extends to a terminal edge of the second electrical contact such that the second electrical contact does not include a stub between the terminal edge of the second electrical contact and the contact area.

2. The electrical connector of claim 1, wherein an edge of the protrusion that is distal relative to the opening is configured to extend past an edge of the second electrical contact that is proximal to the edge of the PCB by a distance ranging from 5 mils to 8 mils when the edge of the PCB is fully seated in the socket.

3. The electrical connector of claim 1, wherein a terminal edge of the base portion extends past a terminal edge of the protrusion by a distance ranging from 5 mils to 8 mils.

4. The electrical connector of claim 1, wherein a ratio of a length of the protrusion to the length of the base portion is inclusively between one tenth and two fifths.

5. The electrical connector of claim 1, wherein the electrical contact further comprises:
    one or more additional indentations on the first side of the base portion; and
    one or more additional protrusions on the second side of the base portion, wherein the one or more additional protrusions are positioned opposite the one or more additional indentations.

6. The electrical connector of claim 1, a ratio of the width of the protrusion to the width of the base portion is inclusively between one tenth and four fifths.

7. The electrical connector of claim 1, wherein the protrusion and the indentation are centered relative to a direction of the width of the base portion.

8. An apparatus comprising:
    a socket with an opening;
    a first electrical contact positioned within an interior region of the socket, the first electrical contact comprising:
        a base portion, wherein a length of the base portion is greater than a width of the base portion;
        an indentation in a first side of the base portion; and
        a protrusion on a second side of the base portion, wherein:
            the second side of the base portion is opposite the first side and the protrusion is opposite the indentation, and
            a width of the protrusion is less than the width of the base portion;
    a printed circuit board (PCB) comprising:
        an edge of the PCB that is seated in the socket via the opening;
        a second electrical contact that is positioned along the edge of the PCB and is pressed against the protrusion via a resilient force of the first electrical contact wherein a contact area over which the first electrical contact and the second electrical contact touch each other extends to an edge of the second electrical contact that is proximal to the edge of the PCB such that the second electrical contact does not include a stub between the edge of the second electrical contact and the contact area.

9. The apparatus of claim 8, wherein an edge of the protrusion that is distal relative to the opening is configured to extend past the edge of the second electrical contact that is proximal to the edge of the PCB by a distance ranging from 5 mils to 8 mils.

10. The apparatus of claim 8, wherein a terminal edge of the base portion extends past a terminal edge of the protrusion by a distance ranging from 5 mils to 8 mils.

11. The apparatus of claim 8, wherein a ratio of a length of the protrusion to the length of the base portion is inclusively between one tenth and two fifths.

12. The apparatus of claim 8, wherein the first electrical contact further comprises:
    one or more additional indentations on the first side of the base portion; and
    one or more additional protrusions on the second side of the base portion, wherein the one or more additional protrusions are positioned opposite the one or more additional indentations.

13. The apparatus of claim 8, wherein a ratio of the width of the protrusion to the width of the base portion is inclusively between one tenth and four fifths.

14. The apparatus of claim 8, wherein the protrusion and the indentation are centered relative to a direction of the width of the base portion.

\* \* \* \* \*